United States Patent
Furukawa et al.

(10) Patent No.: US 7,220,996 B2
(45) Date of Patent: May 22, 2007

(54) SEMICONDUCTOR LIGHT-EMITTING DEVICE

(75) Inventors: Kazuyoshi Furukawa, Kawasaki (JP); Yoshinori Natsume, Yokohama (JP); Wakana Nishiwaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 11/208,638

(22) Filed: Aug. 23, 2005

(65) Prior Publication Data
US 2006/0043386 A1 Mar. 2, 2006

(30) Foreign Application Priority Data
Aug. 24, 2004 (JP) ............... 2004-243615

(51) Int. Cl.
*H01L 27/15* (2006.01)
*H01L 31/12* (2006.01)
(52) U.S. Cl. ............ 257/79; 257/89; 257/103
(58) Field of Classification Search ............ 257/79, 257/89, 95, 103, 184
See application file for complete search history.

(56) References Cited

U.S. PATENT DOCUMENTS

| | | | |
|---|---|---|---|
| 4,738,935 A | | 4/1988 | Shimbo et al. |
| 5,087,949 A | | 2/1992 | Haitz |
| 5,491,350 A | * | 2/1996 | Unno et al. ............ 257/99 |
| 6,091,085 A | * | 7/2000 | Lester ............ 257/98 |
| 6,465,809 B1 | | 10/2002 | Furukawa et al. |
| 6,528,823 B2 | | 3/2003 | Akaike et al. |
| 6,815,312 B2 | | 11/2004 | Furukawa et al. |
| 2006/0043386 A1 | | 3/2006 | Furukawa et al. |

FOREIGN PATENT DOCUMENTS

JP 2002-190619 7/2002

OTHER PUBLICATIONS

U.S. Appl. No. 11/538,646, filed Oct. 4, 2006, Kato et al.
U.S. Appl. No. 11/208,654, filed Aug. 23, 2005, Miyagaki et al.
U.S. Appl. No. 11/208,638, filed Aug. 23, 2005, Furukawa et al.

* cited by examiner

*Primary Examiner*—Theresa T. Doan
(74) *Attorney, Agent, or Firm*—Oblon, Spivak, McClelland, Maier & Neustadt, P.C.

(57) ABSTRACT

A semiconductor light-emitting device including a light-emitting portion permitting light at a specific wavelength and having two surfaces opposite each other. The device also includes a first type of semiconductor substrate and a second type semiconductor substrate which are integrally joined to corresponding surfaces of the light-emitting portion and are substantially transparent to the wavelength. The semiconductor substrates have a joined surface on the surfaces of the light-emitting portion and outer side surfaces which have the width large on a side near the light-emitting portion and become narrow on a side away from the light-emitting portion and further surfaces opposite the joined surfaces. The device also includes first and second electrodes which are disposed on the corresponding further surfaces, a semiconductor layer in a region of at least one of the semiconductor substrates, and an impurity that causes current flow in concentrated manner through the middle of the light-emitting portion.

15 Claims, 6 Drawing Sheets

SEMICONDUCTOR LIGHT-EMITTING DEVICE

CROSS REFERENCE TO RELATED APPLICATIONS

This application claims the benefit of priority under 35USC §119 to the Japanese patent application No. 2004-243615, filed on Aug. 24, 2004, the contents of which are incorporated by reference herein.

BACKGROUND OF THE INVENTION

1. Field of the Invention

The present invention relates to a semiconductor light-emitting device.

2. Related Background Art

Recent years have seen various proposals of semiconductor light-emitting devices made from InGaAlP-based materials, which emit light in a visible region and are widely used in displays and the like. Conventional semiconductor light-emitting devices are provided with, for example, an InGaAlP-based double heterojunction structure obtained by causing an n-type clad layer, an active layer and a p-type clad layer to grow epitaxially on an n-type GaAs substrate subsequently, an n-side electrode is formed on the bottom surface of the n-type GaAs substrate and a p-side electrode is provided in a contact layer on the p-type clad layer.

By selecting the band gaps and lattice constants of the active layer and the n-type/p-type clad layers which form this double heterojunction structure optimally according to design values, it is possible to confine carriers and to cause light to be emitted with a desired wavelength in a visible-ray region in increased efficiency.

For example, when the composition of the active layer which undergoes epitaxial growth is expressed by $In_{0.5}(Ga_{(1-x)}Al_x)_{0.5}P$ and the composition of the n-type/p-type clad layer is expressed by $In_{0.5}(Ga_{(1-y)}Al_y)_{0.5}P$, light emission from the red color band to the green color band can be obtained by appropriately selecting the amount of X or Y.

A GaAs substrate, which is the commonest in terms of the ease with which substrate procurement, lattice matching, etc. are performed, is used in InGaAlP-based double heterojunction semiconductor light-emitting devices. However, because the band gap wavelength of GaAs is 0.87 µm, the absorption coefficient of what is called visible light of not more than 0.87 µm becomes large and hence for a visible light semiconductor light-emitting device, about half the emitted light is absorbed in a GaAs substrate and luminance decreases.

In order to prevent the absorption of emitted visible light by a GaAs substrate, it is necessary only that a material transparent to visible light be used in the substrate. GaP is available as a general transparent semiconductor material. However, because a GaP substrate cannot ensure lattice matching with an InGaAlP-based material, it is difficult to cause good epitaxial crystals to grow. For this reason, there has been proposed a semiconductor light-emitting device which is fabricated by bonding together an InGaAlP-based epitaxial layer which has grown on a GaAs substrate and the GaP substrate directly in the form of wafers and removing the GaAs substrate thereafter.

With this semiconductor light-emitting device, the use of the bonded transparent GaP substrate enables the absorption of the emitted visible light to be suppressed and, therefore, a decrease in luminance can be prevented compared to a case where a GaAs substrate is used. Furthermore, there have been proposed semiconductor light-emitting devices having a substantially spherical shape as a general which are constituted by a substantially semispherical transparent p-type GaP bonded substrate, a substantially semispherical n-type GaP bonded substrate, and a light-emitting diode layer (corresponding to a light-emitting layer forming portion, which will be described later) formed from an epitaxial layer sandwiched between the two in order to increase luminance, i.e., the light extraction efficiency (refer to, for example, the Japanese Patent Laid-Open No. 2002-190619 (page 4, FIG. 1)).

In this disclosed semiconductor light-emitting device, because the ratio at which the emitted visible light is absorbed by a substrate is very low and because of the spherical outer shape, it is expected that the ratio at which the visible light which is emitted in the middle part near the center of the sphere can be taken out to the outside of the semiconductor light-emitting device also increases. However, because in the case of the light which is emitted in the light-emitting layer present near the spherical surface off the center, the ratio at which an angle at which the light becomes incident on the spherical surface deviates greatly from 90 degrees increases, the light which can be taken out to the outside of the semiconductor light-emitting device decreases. Specifically, although the ratio at which an inputted current is used for light emission in the middle part of the sphere is high from where the visible light can be taken out to the outside with good efficiency due to the spherical outer shape, the current also flows into the light-emitting layer present near the spherical surface from which the light cannot be taken out to the outside with good efficiency even with the spherical outer shape, thereby posing the problem that luminance is not insufficient for the inputted current. In other words, the problem was that the quantity of light which is capable of being taken out is small for an inputted current.

SUMMARY OF THE INVENTION

According to a first aspect of the present invention, there is provided a semiconductor light-emitting device, comprising:

a light-emitting layer forming portion which has a pn-junction permitting light emission at a specific wavelength and has two principal surfaces opposite each other;

a semiconductor substrate of a first conductivity type which is integrally joined to one principal surface of the light-emitting layer forming portion and is substantially transparent to the wavelength, the semiconductor substrate of the first conductivity type having a joined surface on the one principal surface of the light-emitting layer forming portion, an outer side surface which is inclined so that the width is large on a side near the light-emitting layer forming portion and becomes narrow on a side away from the light-emitting layer forming portion and a further surface opposite the joined surface of the semiconductor substrate of the first conductivity type;

a first electrode which is disposed on the further surface of the semiconductor substrate of the first conductivity type;

a semiconductor substrate of a second conductivity type which is integrally joined to the other principal surface of the light-emitting layer forming portion and is substantially transparent to the wavelength, the second conductivity being reverse to the first conductivity, the semiconductor substrate of the second conductivity type having a joined surface on the other principal surface of the light-emitting layer forming portion, an outer side surface which is inclined so that the width is large on a side near the light-emitting layer forming portion and becomes narrow on a side away from the light-emitting layer forming portion and a further surface opposite the joined surface of the semiconductor substrate of the second conductivity type;

a second electrode which is disposed on the further surface of the semiconductor substrate of the second conductivity type; and a semiconductor layer selectively formed in a region of at least one of the semiconductor substrate of the first conductivity type and the semiconductor substrate of the second conductivity type, an impurity being introduced into the semiconductor layer so that a current is caused to flow in concentrated manner through a middle part of the principal surfaces of the light-emitting layer forming portion via the first electrode and the second electrode.

According to a second aspect of the present invention, there is provided a semiconductor light-emitting device comprising:

a light-emitting layer forming portion which has a pn-junction permitting light emission at a specific wavelength and has two principal surfaces opposite each other;

a semiconductor substrate of a first conductivity type which is integrally joined to one principal surface of the light-emitting layer forming portion and is substantially transparent to the wavelength, the semiconductor substrate of the first conductivity type having a joined surface on the one principal surface of the light-emitting layer forming portion and a further surface opposite the joined surface of the semiconductor substrate of the first conductivity type;

a first electrode which is disposed on the further surface of the semiconductor substrate of the first conductivity type;

a semiconductor substrate of a second conductivity type which is integrally joined to the other principal surface of the light-emitting layer forming portion and is substantially transparent to the wavelength, the second conductivity being reverse to the first conductivity, the semiconductor substrate of the second conductivity type having a joined surface on the other principal surface of the light-emitting layer forming portion and a further surface opposite the joined surface of the semiconductor substrate of the second conductivity type;

a second electrode which is disposed on the further surface of the semiconductor substrate of the second conductivity type; and a semiconductor layer formed in a middle part of the joined surface of at least one of the semiconductor substrate of the first conductivity type and the semiconductor substrate of the second conductivity type, an impurity of the same conductivity type as the conductivity type of the semiconductor substrate on which the semiconductor layer is formed being introduced in the semiconductor layer so as to have a higher carrier concentration than portions other than the middle part of the semiconductor substrate on which the semiconductor layer is formed;

at least one of the semiconductor substrate of the first conductivity type and the semiconductor substrate of the second conductivity type having an outer side surface which is inclined so that the width is large on a side near the light-emitting layer forming portion and becomes narrow on a side away from the light-emitting layer forming portion.

According to a third aspect of the present invention, there is provided a semiconductor light-emitting device comprising:

a light-emitting layer forming portion which has a pn-junction permitting light emission at a specific wavelength and has two principal surfaces opposite each other;

a semiconductor substrate of a first conductivity type which is integrally joined to one principal surface of the light-emitting layer forming portion and is substantially transparent to the wavelength, the semiconductor substrate of the first conductivity type having a joined surface on the one principal surface of the light-emitting layer forming portion, an outer side surface which is inclined so that the width is large on a side near the light-emitting layer forming portion and becomes narrow on a side away from the light-emitting layer forming portion and a further surface opposite the joined surface of the semiconductor substrate of the first conductivity type;

a first electrode which is disposed on the further surface of the semiconductor substrate of the first conductivity type;

a semiconductor substrate of a second conductivity type which is integrally joined to the other principal surface of the light-emitting layer forming portion and is substantially transparent to the wavelength, the second conductivity being reverse to the first conductivity, the semiconductor substrate of the second conductivity type having a joined surface on the other principal surface of the light-emitting layer forming portion, an outer side surface which is inclined so that the width is large on a side near the light-emitting layer forming portion and becomes narrow on a side away from the light-emitting layer forming portion and a further surface opposite the joined surface of the semiconductor substrate of the second conductivity type; and a second electrode which is disposed on the further surface of the semiconductor substrate of the second conductivity type;

at least one of the semiconductor substrate of the first conductivity type and the semiconductor substrate of the second conductivity type having an interstice located near the outer side surface on a side close to the light-emitting layer forming portion and around the joined surface on the principal surface of the light-emitting layer forming portion.

Figure 4A:
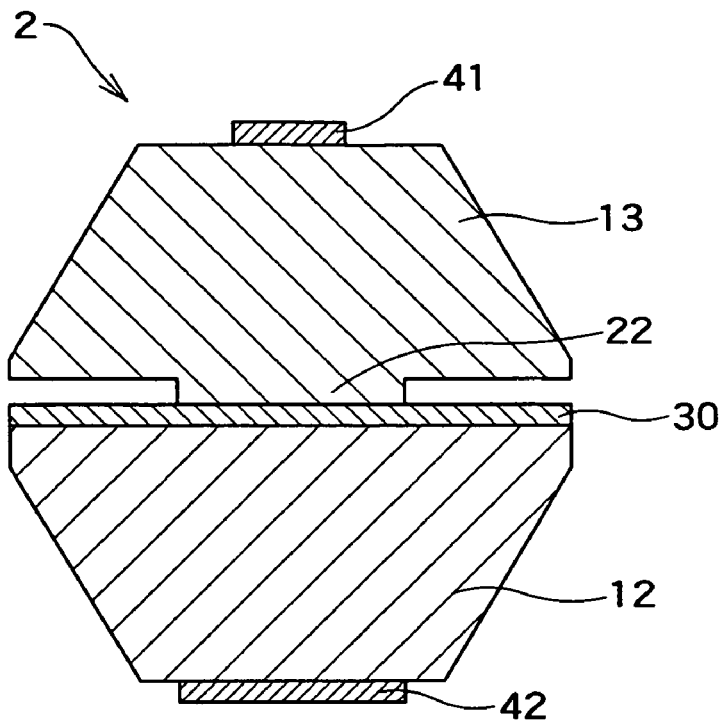
Figure 4B:
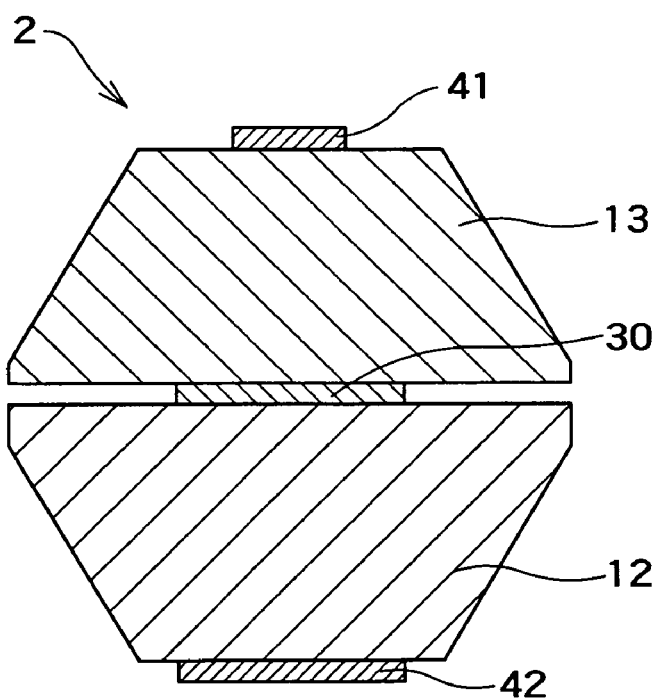
Figure 5:
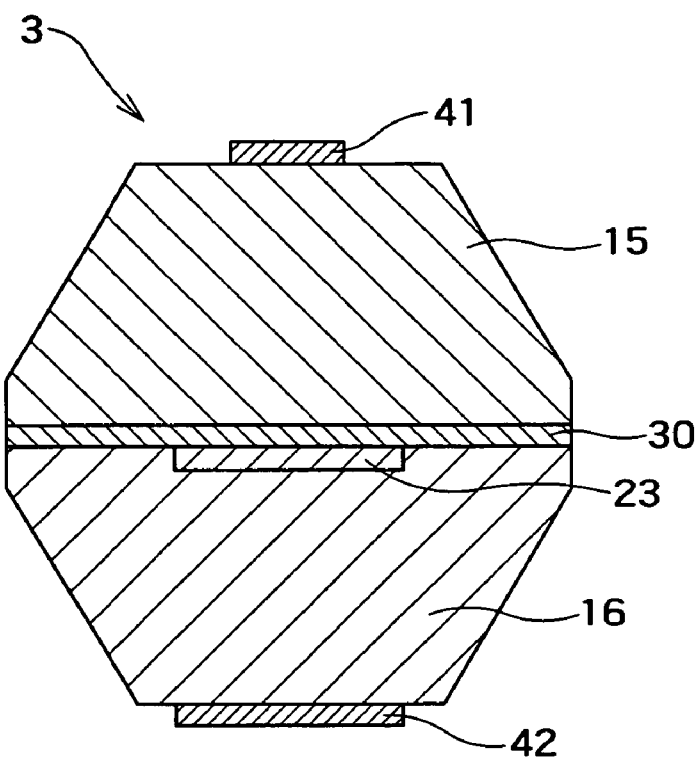
Figure 6:
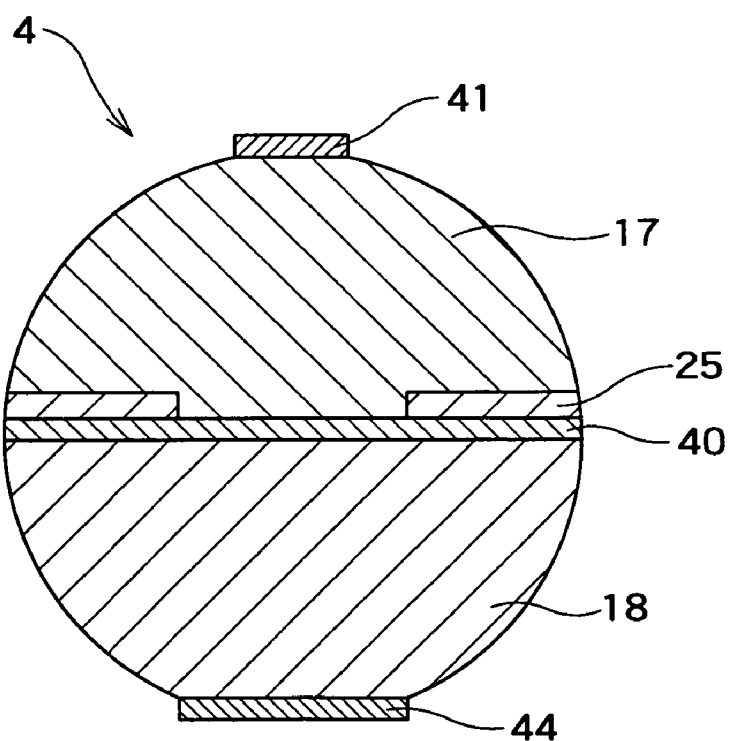
Figure 7:
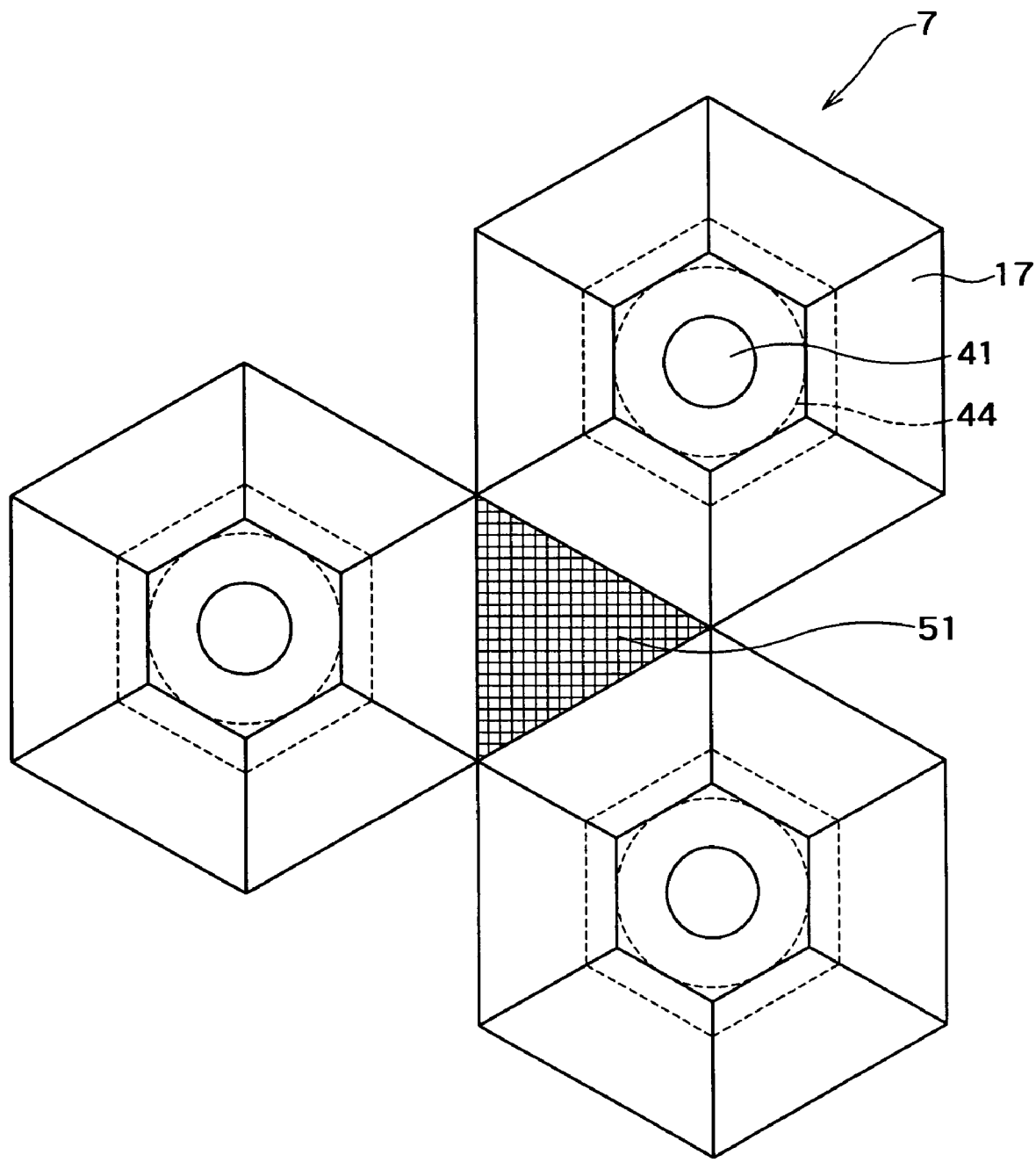

Each of FIGS. 4A and 4B is a sectional view which schematically shows the construction of a semiconductor light-emitting device related to the second embodiment of the present invention;

FIG. 5 is a sectional view which schematically shows the construction of a semiconductor light-emitting device related to the third embodiment of the present invention;

FIG. 6 is a sectional view which schematically shows the construction of a semiconductor light-emitting device related to the fourth embodiment of the present invention; and FIG. 7 is a plan view which schematically shows the construction of a semiconductor light-emitting device related to the fourth embodiment of the present invention during the manufacturing thereof.

DETAILED DESCRIPTION OF THE INVENTION

Embodiments of the present invention will be described below by referring to the drawings. In the drawings shown below, like reference numerals refer to like component elements.

(Embodiment 1)

Figure 1A:
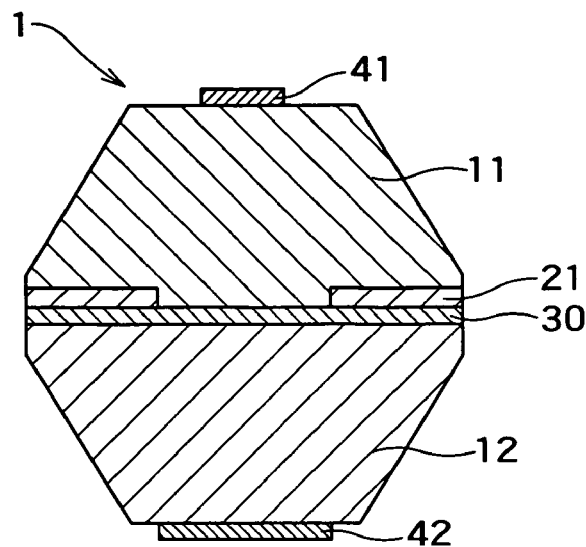
FIG. 1A is a sectional view which schematically shows the construction of a semiconductor light-emitting device related to the first embodiment of the present invention.
Figure 1B:
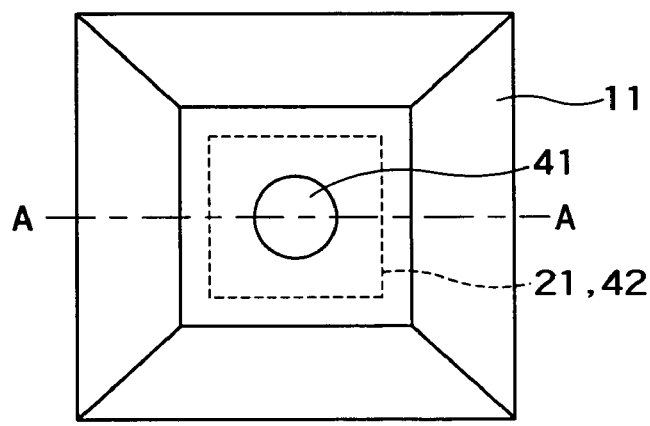
FIG. 1B is a plan view which schematically shows the construction of a semiconductor light-emitting device related to the first embodiment of the present invention.
Figure 1C:
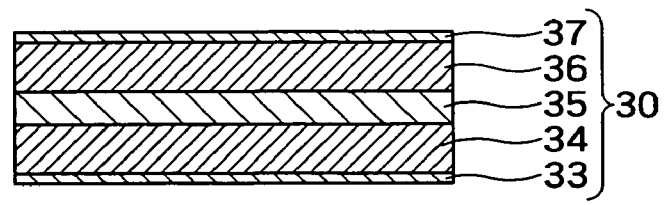
FIG. 1C is a partial sectional view of a semiconductor light-emitting device related to the first embodiment of the present invention.
Figure 2A:
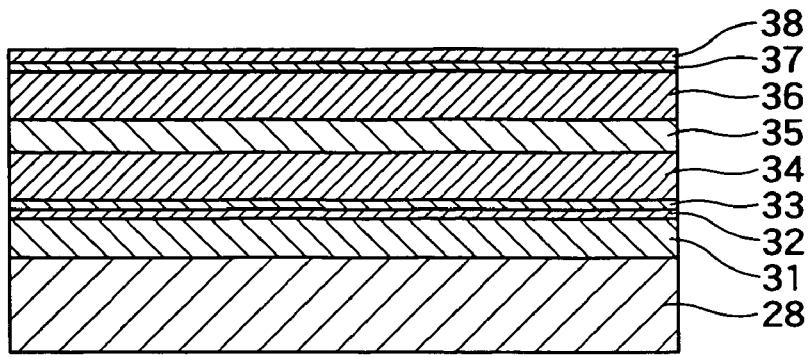
FIGS. 2A to 3C are each a view which schematically shows a method of manufacturing a semiconductor light-emitting device related to the first embodiment of the present invention in order of step.

A semiconductor light-emitting device related to the first embodiment of the present invention, including a manufacturing method thereof, will be described by referring to FIGS. 1A to 3C. FIGS. 1A to 1C schematically show the construction of the semiconductor light-emitting device. FIG. 1A is a sectional view, FIG. 1B is a plan view, FIG. 1A is a sectional view taken along the line A—A of FIG. 1B, and FIG. 1C is a partial sectional section in which the part of epitaxial layers is enlarged. FIGS. 2A to 2D are each a sectional view of layer construction which schematically shows a method of manufacturing the semiconductor light-emitting device in order of step and FIGS. 3A to 3C are each a view which schematically shows the method of manufacturing the semiconductor light-emitting device in order of step after the step shown in FIG. 2D.

First, as shown in FIG. 1A, the main part of a semiconductor light-emitting device 1 is provided with a light-emitting layer forming portion 30 including an active layer, a p-type GaP wafer 11, which is a semiconductor substrate of the first conductivity type, which forms a junction with one principal surface of this light-emitting layer forming portion 30, forms n-type inversion layer 21 in a neighboring part in the vicinity of a junction surface and has an outer side surface the width of which becomes narrow as it becomes away from the junction surface, an n-type GaP wafer 12 of the second conductivity type which forms a junction with the other principal surface of this light-emitting layer forming portion 30 and has an outer side surface the width of which becomes narrow as it becomes away from the junction surface, a p-side electrode 41 which is formed on a surface on the opposite side of a surface opposed to the light-emitting layer forming portion 30 of the p-type GaP wafer 11, and an n-side electrode 42 which is formed on a surface on the opposite side of a surface opposed to the light-emitting layer forming portion 30 of the n-type GaP wafer 12. Furthermore, the inversion layer 21, which is a semiconductor layer, is formed in the p-type GaP wafer 11 layer in a manner adjoining the light-emitting layer forming portion 30.

More particularly, the middle part of the p-type GaP wafer 11 having an energizable carrier concentration, which forms a junction with the upper side of the drawing shown in FIG. 1A, i.e., with the principal surface on the upper side of the light-emitting layer forming portion 30 is rectangular. The part of this rectangular p-type middle part along the light-emitting layer forming portion 30 and near the light-emitting layer forming portion 30 is the inversion layer 21 the conductivity type of which is inverted into the n-type, for example, by ion implantation. The inversion layer 21 in contact with this light-emitting layer forming portion 30 defines a rectangular boundary along the light-emitting layer forming portion 30, as indicated by the broken lines of FIG. 1B. The area of this rectangle is preferably approximately ¼ to ¹/₁₀ of the whole area which forms a junction with the light-emitting layer forming portion 30 including the inversion layer 21, and this area is about ⅙ in this embodiment.

The outer shape of the p-type GaP wafer 11 is a polyhedron constituted by a surface on which the p-side electrode 41 is formed and which is parallel to the light-emitting layer forming portion 30, four surfaces perpendicular to the light-emitting layer forming portion 30, and four surfaces which are each formed so as to produce an angle of about 120 degrees with these four perpendicular surfaces and the surface on which the p-side electrode 41 is formed.

The light-emitting layer forming portion 30 present in the middle part in the vertical direction of the drawing shown in FIG. 1A is formed from epitaxial growth layers. As shown in FIG. 1C, the light-emitting layer forming portion 30 is constituted by an active layer 35 in the middle, a p-type clad layer 36 provided on one surface of the active layer 35, a first bonded layer 37 provided on a surface of this p-type clad layer 36, an n-type clad layer 34 provided on the other side of the active layer 35 opposed to one surface thereof, and a second bonded layer 33 provided on a surface of this n-type clad layer 34. Incidentally, it is possible to omit both or one of the first bonded layer 37 and the second bonded layer 33.

The n-type GaP wafer 12 having an energizable carrier concentration, which forms a junction with the lower side shown in FIG. 1A, i.e., with the principal surface the lower side of the light-emitting layer forming portion 30 is in substantially plane relation to the p-type GaP wafer 11 with respect to the light-emitting layer forming portion 30. The four surfaces perpendicular to the light-emitting layer forming portion 30 of the n-type GaP wafer 12 are each formed so as to form the same plane surfaces as the four surfaces perpendicular to the light-emitting layer forming portion 30 of the p-type GaP wafer 11. Therefore, apparently, the number of the surfaces perpendicular to the light-emitting layer forming portion 30 can be regarded as to be four and, as a result, the outer shape of the semiconductor light-emitting device 1 becomes a roughly 14-hedron.

Next, the details of the component elements of the semiconductor light-emitting device 1 will be described with reference to FIGS. 2A to 3C in order of manufacturing process of the semiconductor light-emitting device 1. As shown in FIG. 2A, epitaxial growth layers are formed by using, for example, a known MOCVD (metal organic chemical vapor deposition) apparatus and the like.

A Si doped n-type GaAs substrate 28 in the form of a wafer having a diameter of 3 inches (about 76 mm) is prepared, and epitaxially grown are an about 0.5 μm thick buffer layer 31 formed from n-type GaAs on a surface of the n-type GaAs substrate 28, an about 0.05 μm thick etching stop layer 32 formed from n-type InAlP on a surface of the buffer layer 31, an about 0.05 μm thick second bonded layer 33 formed from n-type InGaP on a surface of the etching stop layer 32, an about 0.6 μm thick n-type clad layer 34 formed from n-type InGaAlP on a surface of the second bonded layer 33, an about 0.4 μm thick active layer 35 formed from InGaAlP on a surface of the n-type clad layer 34, an about 0.6 μm thick p-type clad layer 36 formed from p-type InGaAlP on a surface of the active layer 35, an about 0.05 μm thick first bonded layer 37 formed from p-type GaAs on a surface of the clad layer 36, and an about 0.15 μm thick cover layer 38 formed from InAlP on a surface of the first bonded layer 37.

These epitaxial growth layers may be active layers of MQW (multi-quantum well) structure as required, or a current diffusion layer and the like may be added. Also, for example, the n-type/p-type clad layers 34, 36 may also be replaced with a ternary layer.

Figure 2B:
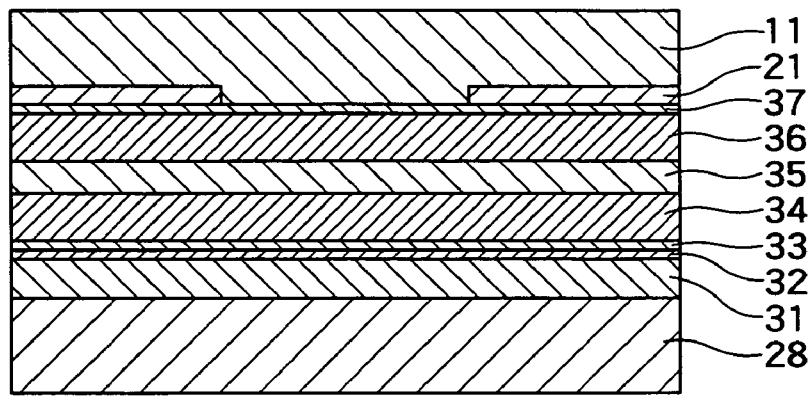
Figure 3A:
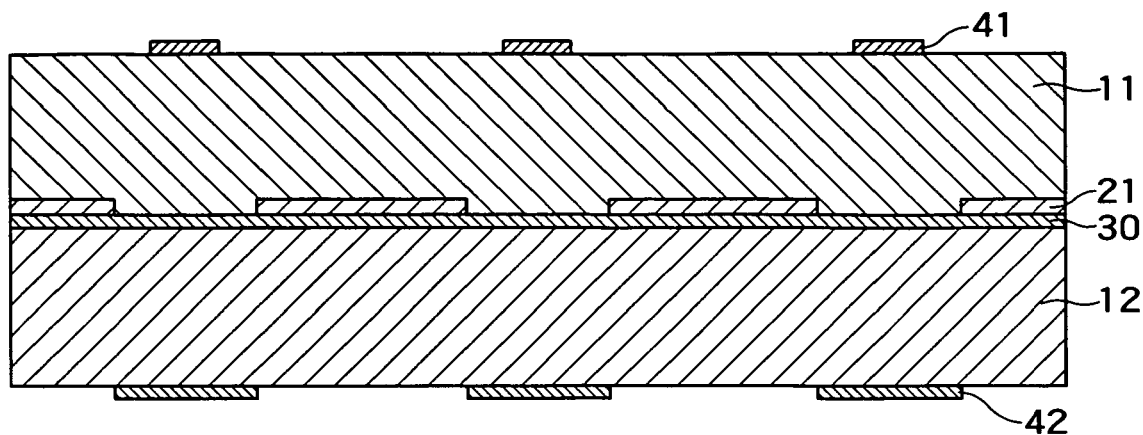
Figure 3B:
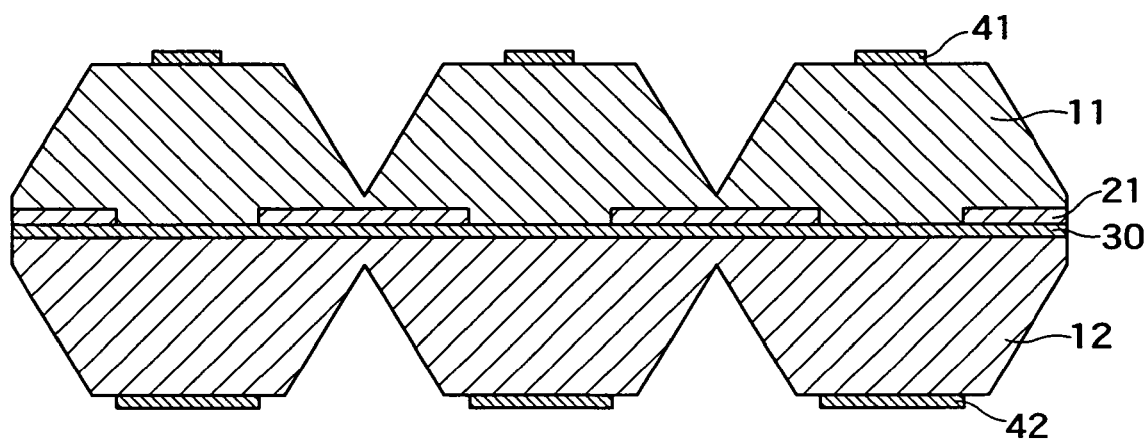
Figure 3C:
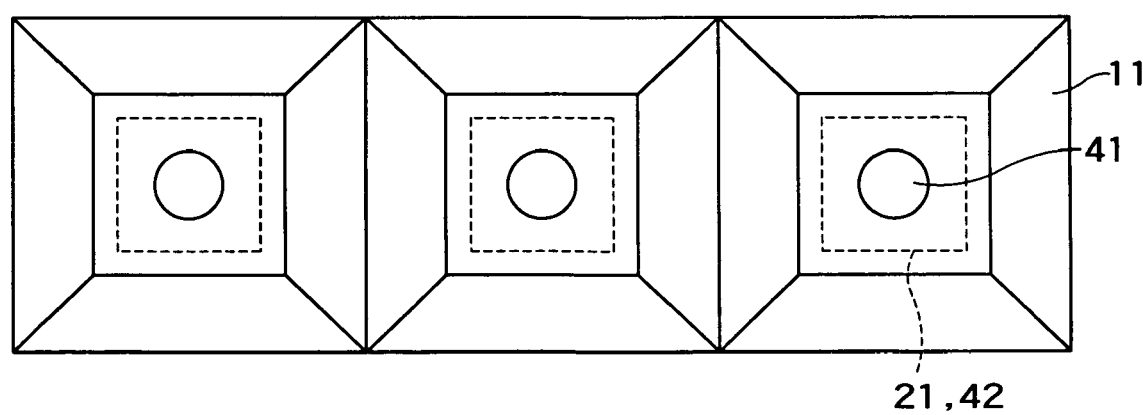

Next, as shown in FIG. 2B, a p-type GaP wafer 11 is integrally joined to the first bonded layer 37. First, the p-type GaP wafer 11 which has a diameter of 3 inches and a thickness of 250 μm and which has been Zn doped to a concentration of 3 E17/cm$^3$ is patterned so as to ensure a region which becomes a current channel as a light-emitting device when separated into individual devices, and in a region around a region which becomes a rectangular current channel, an n-type inversion layer 21 is formed to make preparations, for example, by the ion implantation of Si.

The epitaxially grown n-type GaAs substrate 28 is taken out of the MOCVD (metal organic chemical vapor deposition) apparatus in wafer condition and the cover layer 38 on the surface is removed by etching with phosphoric acid, with the result that the first bonded layer 37 is exposed to the surface.

The prepared p-type GaP wafer 11 is cleaned with a surfactant, immersed in dilute hydrofluoric acid to remove a natural oxide film on the surface and dried on a spinner after rinsing with water. As with the p-type GaP wafer 11, the first bonded layer 37 is subjected to treatment with dilute hydrofluoric acid to remove a natural oxide layer on the surface and dried on a spinner after rinsing with water.

Next, with the first bonded layer 37 set so as to face upward and with the p-type GaP wafer 11 placed on the first bonded layer 37 so that the surface of the p-type GaP wafer 11 to be bonded faces downward, the first bonded layer 37 and the p-type GAP wafer 11 are bonded together at room temperature. In order to increase the bonding strength between the first bonded layer 37 and the p-type GaP wafer 11, for example, the first heat treatment is performed in a furnace in an argon atmosphere containing 10% hydrogen at 300° C. for 1 hour. The temperature of the first heat treatment is preferably in the range of not less than 150° C. but less than 600° C. and more preferably in the range of not less than 200° C. but not more than 500° C. The effect of an increase in the bonding strength begins to be obtained at 150° C. and becomes remarkable at not less than 200° C. When the temperature of the first heat treatment exceeds 500° C., a difference in thermal expansion between the n-type GaAs substrate 28 and the p-type GaP wafer 11 and during the heat treatment, slip may sometimes occur in the p-type GaP wafer 11. Slip occurs in more than half of wafers at not less than 600° C.

Figure 2C:
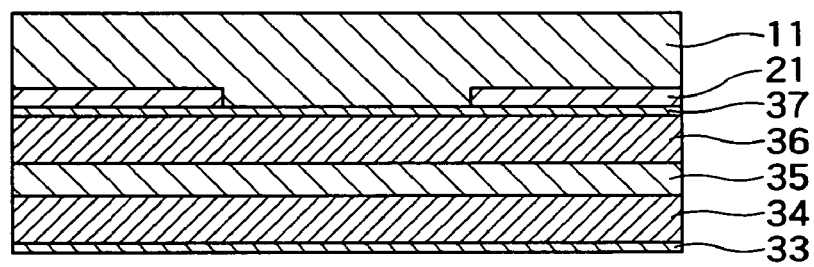

Next, as shown in FIG. 2C, the portions which do not relate to light emission or bonding on the side of the n-type GaAs substrate 28 used as an epitaxial growth substrate are removed. The n-type GaAs substrate 28 and the buffer layer 31 are removed by etching with a mixed liquid of ammonia and an aqueous solution of hydrogen peroxide. After that, the etching stop layer 32 is removed, for example, by etching with phosphoric acid at 70° C. and the second bonded layer 33 is exposed to the surface.

Figure 2D:
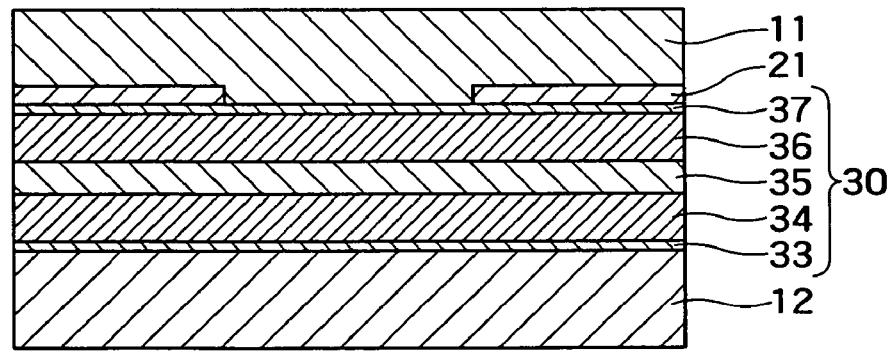

Next, as shown in FIG. 2D, an n-type GaP wafer 12 is integrally joined to the second bonded layer 33. Here, the second bonded layer 33 is cleaned with a surfactant, immersed in dilute hydrofluoric acid to remove a natural oxide film on the surface and dried on a spinner after rinsing with water. The n-type GaP wafer 12 which has a diameter of 3 inches and a thickness of 250 µm and which has been Si doped with a concentration of 3 E17/cm$^3$ is subjected to the same treatment as with the above-described p-type GaP wafer 11. With the second bonded layer 33 set so as to face upward and with the n-type GaP wafer 12 placed on the second bonded layer 33 so that the surface of the n-type GaP wafer 12 to be bonded faces downward, the second bonded layer 33 and the n-type GaP wafer 12 are bonded together at room temperature.

After that, the second heat treatment is performed in a furnace in an argon atmosphere containing 10% hydrogen at 800° C. for 1 hour, whereby a junction is formed between the second bonded layer 33 and the n-type GaP wafer 12 and between the first bonded layer 37 and the p-type GaP wafer 11 to ensure sufficient mechanical strength and electrical junction. At this stage, a structure is obtained in which the light-emitting layer forming portion 30 formed from epitaxial layers is bonded to the p-type and n-type GaP wafers 11 and 12 from both sides thereof.

Incidentally, it is preferred that the temperature of the second heat treatment be in the range of 600° C. to 900° C. If the heat treatment temperature is less than 600° C., the junction reaction at the bonded interface is insufficient and thus resulting in insufficient mechanical strength and the electric resistance remains to be in a high condition. Conversely, if the heat treatment temperature exceeds 900° C., the structure of the light-emitting layer forming portion 30 collapses due to the diffusion of atoms and luminance decreases remarkably.

Next, as shown in FIG. 3A, electrodes are formed on outer side surfaces parallel to the light-emitting layer forming portion 30 of the p-type GaP wafer 11 and the n-type GaP wafer 12. On the outer side surface of the p-type GaP wafer 11 opposed to a p-type region which becomes a rectangular current channel along the light-emitting layer forming portion 30 of the p-type GaP wafer 11, patterning is performed, AuZn/Au are deposited and heat treatment is performed, whereby a p-side electrode 41 is formed.

Next, on the outer side surface of the n-type GaP wafer 12 opposed to the p-side electrode 41 of the n-type GaP wafer 12, patterning is performed, AuGe/Au are deposited and heat treatment is performed, whereby an n-side electrode 42 is formed. In both the p-side and n-side electrodes 41, 42, the spacing between adjacent electrodes is 500 µm. The shape of the p-side electrode 41 is a circle having a diameter of 100 µm and the shape of the n-side electrode 42 is a rectangle having a side of 200 µm.

Next, as shown in FIGS. 3B and 3C, the structure provided with the p-side and n-side electrodes 41, 42 is separated into individual semiconductor light-emitting devices 1. The p-side and n-side electrodes 41, 42 are disposed in the center position of the surfaces on which these electrodes are formed after separation into individual devices. In separation into individual devices, a diamond blade (not shown) having a V-shaped section with a blade tip angle of 60 degrees is prepared and V-shaped grooves having a depth of, for example, about 240 µm are formed in gridiron shape by use of a dicer (not shown) starting from one surface of the structure provided with electrodes. Incidentally, the side opposite to the side where the V-shaped grooves are formed is protected, for example, with an adhesive tape (not shown).

Next, starting from the other surface of the structure, V-shaped grooves having a depth of, for example, about 240 µm are formed in gridiron shape. The V-shaped grooves formed starting from the two surfaces are in a positional relation which is opposed vertically in the figure, with the light-emitting layer forming portion 30 present between these grooves. Portions which remain without being separated because of opposed V-shaped grooves are separated by cleavage on an adhesive tape (not shown) which has been re-applied on the opposite side. As a result, a semiconductor light-emitting device 1 as shown in FIG. 1A is completed.

After the p-side electrode 41 and the n-side electrode 42 are each brought into a condition permitting connection with an outer power source for driving, this semiconductor light-emitting device 1 is sealed, usually, with epoxy resin (not shown) and used.

When the semiconductor light-emitting device 1 is energized from the p-side electrode 41 and n-side electrode 42 thereof, the current flows selectively through the part of the p-type in which the inversion layer 21 is not present because the current is cut off in the part of the inversion layer 21. As a result, the current channel is limited to the middle part of the light-emitting layer forming portion 30. Therefore, injected carriers bond again in a concentrated manner in the active layer 35 in the middle part of this light-emitting layer forming portion 30 and emit light. The area of the light-emitting portion in the middle part is about 1/6 of the junction surface of the light-emitting layer forming portion 30. The light emitted in all directions from the active layer 35 becomes incident on the substantially transparent p-type and n-type GaP wafers 11, 12 from the light-emitting layer forming portion 30 and advances to the interface which defines the outer shape of the p-type and n-type GaP wafers 11, 12.

When light is taken from a GaP wafer into an epoxy resin, as is known well, it is necessary that the incident angle be not more than about 27 degrees (critical angle) because of the difference in the refractive angle. For example, the light which is emitted substantially perpendicularly from the light-emitting layer forming portion 30 limited to the middle part, is taken out, at a critical angle of not more than about 27 degrees, from the interface at which the p-side or n-side electrode 41, 42 parallel to the light-emitting layer forming portion 30 to the outside and part of the light is reflected from the p-side or n-side electrode 41, 42 and taken out to the outside from the opposite direction. The light which is focused on the middle part and radiated from the light-emitting layer forming portion 30 in a direction of an inclined surface of about 120 degrees from the interface at which the p-side or n-side electrode 41, 42 is formed, has a high percentage at which the light becomes incident at angles of not more than the critical angle of about 27 degrees and is taken out from the inclined surface to the outside.

For comparison, the first comparative semiconductor light-emitting device (not shown) was fabricated in which the inversion layer 21 is not formed in the semiconductor light-emitting device 1 and all other constituent features are the same as the semiconductor light-emitting device 1. It became apparent that the luminance of the semiconductor light-emitting device 1 relative to inputted power, i.e., the light extraction efficiency is about 25% better than in the first comparative semiconductor light-emitting device. As a result, wider applications of the semiconductor light-emitting device 1 become possible for portable equipment for which the light extraction efficiency is important.

In the semiconductor light-emitting device 1, the light-emitting portion is limited to the middle part of the light-emitting layer forming portion 30 by narrowing the current channel connecting the p-side electrode 41 and the n-side electrode 42 together, whereby an increase in the light extraction efficiency could be achieved. Incidentally, although the limitation of the current channel was performed by providing the inversion layer 21, the limitation of the current channel can also be realized, for example, by optionally selecting the quantity of implanted ions or the kind of ion thereby to form a high-resistance layer in a position corresponding to the inversion layer 21.

(Embodiment 2)

A semiconductor light-emitting device related to the second embodiment of the present invention will be described by referring to FIGS. 4A and 4B. FIGS. 4A and 4B are each a sectional view which schematically shows the construction of a semiconductor light-emitting device. As shown in FIGS. 4A and 4B, this embodiment differs from the first embodiment in that the middle part of the GaP wafer is selectively bonded to the light-emitting layer forming portion 30. Hereafter, the same component parts as in the first embodiment are designated by like reference numerals, their descriptions are omitted, and only different component parts are described.

First, as shown in FIG. 4A, the main part of a semiconductor light-emitting device 2 is provided with a light-emitting layer forming portion 30 including an active layer, a p-type GaP wafer 13 of the first conductivity type, which has a projection 22 forming a junction with the middle part of one principal surface of this light-emitting layer forming portion 30, an n-type GaP wafer 12 of the second conductivity type which forms a junction with the other principal surface of this light-emitting layer forming portion 30, a p-side electrode 41 which is formed on a surface on the opposite side of a surface opposed to the light-emitting layer forming portion 30 of the p-type GaP wafer 13, and an n-side electrode 42 which is formed on a surface on the opposite side of a surface opposed to the light-emitting layer forming portion 30 of the n-type GaP wafer 12. The outer shape of the semiconductor light-emitting device 2 is the same as in the first embodiment, with the exception that narrow interstices are added adjacent to the light-emitting layer forming portion 30 near the exterior of the p-type GaP wafer 13.

More particularly, the p-type GaP wafer 13 in which a projection 22 is formed and has an energizable carrier concentration is bonded, via the projection 22, to the middle part of the principal surface of the upper side of the light-emitting layer forming portion 30. This projection 22 of the p-type GaP wafer 13 is formed by making recesses in portions around the projection 22 to be left, for example, by etching and it is preferred that the projection 22 has an area of approximately 1/4 to 1/10 of the whole area of the principal surface of the light-emitting layer forming portion 30 to which the p-type GaP wafer 13 is bonded. With the exception of the projection 22 of the junction part and the recesses around the projection 22, the p-type GaP wafer 13 is a polyhedron constituted by a surface on which the p-side electrode 41 is formed and which is parallel to the light-emitting layer forming portion 30, four surfaces perpendicular to the light-emitting layer forming portion 30, and four surfaces which are each formed so as to produce an angle of about 120 degrees with these four perpendicular surfaces and the surface on which the p-side electrode 41 is formed.

The manufacturing method of the semiconductor light-emitting device 2 in which these p-type and n-type GaP wafers 13, 12 are used is the same as in the first embodiment.

When the semiconductor light-emitting device thus fabricated 2 is energized from the p-side electrode 41 and n-side electrode 42 thereof, the current flows through the middle part of the light-emitting layer forming portion 30 via the projection 22. As a result, the current channel is limited to the middle part of the light-emitting layer forming portion 30, and the same effect as in the first embodiment can be obtained. Hence the luminance of the semiconductor light-emitting device 2 with respect to inputted power, i.e., the light extraction efficiency is almost the same as in the first embodiment.

Next, in FIG. 4B, both of the principal surfaces of the p-type and n-type GaP wafers 13, 12 on the light-emitting layer forming portion 30 side are formed flat and the light-emitting layer forming portion 30 is formed with almost the same area as the projection 22 of the p-type GaP wafer 13 of FIG. 4A and integrally bonded to the p-type and n-type GaP wafers 13, 12 by being aligned with the center part of the principal surfaces of the p-type and n-type GaP wafers 13, 12 on the light-emitting layer forming portion 30 side. As a result of this, the principal surfaces of the p-type and n-type GaP wafers 13, 12 on the light-emitting layer forming portion 30 side are opposed to each other around the junction surface with the light-emitting forming part 30 near the outer side surface via narrow interstices. The area of the light-emitting layer forming portion 30 is about ¼ to about ¹⁄₂₀ of the area of the principal surfaces of the p-type and n-type GaP wafers 13, 12 on the light-emitting layer forming portion 30 side. Other constituent features and shape of the semiconductor light-emitting device 2 shown in FIG. 4B are substantially the same as with the semiconductor light-emitting device 2 shown in FIG. 4A.

The manufacturing method of the semiconductor light-emitting device 2 shown in FIG. 4B includes the removal of portions which become the interstices of the light-emitting layer forming portion 30, for example, by etching before the p-type or n-type GaP wafer 13, 12 is bonded to the light-emitting forming part 30. Instead of removing the portions of the light-emitting forming portion 30 before the p-type or n-type GaP wafer 13, 12 is bonded thereto by etching, after the bonding of the light-emitting layer forming portion 30 having the same area as the light-emitting layer forming portion 30 of FIG. 4A to the p-type GaP wafer 13 and the n-type GaP wafer 12 and the separating into individual devices, the size of the light-emitting layer forming portion 30 may be reduced until the light-emitting layer forming portion 30 obtains the area shown in FIG. 3B by selectively removing the peripheral part of the light-emitting layer forming portion 30 by etching from the outer side surface.

When the semiconductor light-emitting device 2 of FIG. 4B thus formed is energized from the p-side electrode 41 and the n-side electrode 42, the current flows through the middle part of the p-type and n-type GaP wafers 13, 12 via the light-emitting forming portion 30 between the two. As a result, the limiting of the current channel is realized and the luminance of the semiconductor light-emitting device 2 relative to inputted power, i.e., the light extraction efficiency is almost the same as in the first embodiment.

(Embodiment 3)

A semiconductor light-emitting device related to the third embodiment of the present invention will be described by referring to FIG. 5. FIG. 5 is a sectional view which schematically shows the construction of a semiconductor light-emitting device. As shown in FIG. 5, this embodiment differs from the first embodiment in that a layer of high carrier concentration, which is a semiconductor layer, is formed adjacent to the middle part of the light-emitting layer forming portion 30. Hereafter, the same component parts as in the first embodiment are designated by like reference numerals, their descriptions are omitted, and only different component parts are described.

First, as shown in FIG. 5, the main part of a semiconductor light-emitting device 3 is provided with a light-emitting layer forming portion 30 including an active layer, a p-type GaP wafer 15 of the first conductivity type, which forms a junction with one principal surface of this light-emitting layer forming portion 30, an n-type GaP wafer 16 of the second conductivity type which forms a junction with the other principal surface of this light-emitting layer forming portion 30 and forms an n-type high carrier concentration layer 23 in a middle part of the junction surface, a p-side electrode 41 which is formed on a surface on the opposite side of a surface opposed to the light-emitting layer forming portion 30 of the p-type GaP wafer 15, and an n-side electrode 42 which is formed on a surface on the opposite side of a surface opposed to the light-emitting layer forming portion 30 of the n-type GaP wafer 16. The outer shape of the semiconductor light-emitting device 3 is the same as in the first embodiment.

More particularly, the p-type GaP wafer 15 having an energizable carrier concentration is bonded to the upper side of the drawing shown in FIG. 5, i.e., with the principal surface of the upper side of the light-emitting layer forming portion 30. The p-type GaP wafer 15 is a polyhedron constituted by a surface on which the p-side electrode 41 is formed and which is parallel to the light-emitting layer forming portion 30, four surfaces perpendicular to the light-emitting layer forming portion 30, and four surfaces which are each formed so as to produce an angle of about 120 degrees with these four perpendicular surfaces and the surface on which the p-side electrode 41 is formed.

In the region of the center part of the n-type GaP wafer 16 which forms a junction with the lower side of the drawing shown in FIG. 5, i.e., the principal surface of the lower side of the light-emitting layer forming portion 30, a high carrier concentration layer 23 which is doped with an n-type impurity at a high concentration is formed so that a current is concentrated compared to the peripheral part having a relatively low carrier concentration.

A description will be given here of the knowledge obtained by the present inventors and others about a mechanism by which a current is concentrated on the middle part of the light-emitting forming layer 30 by forming the high carrier concentration layer 23. The mechanism by which a current is concentrated on the middle part is not only due to a high carrier concentration and low resistance, but also related to a high carrier concentration at a bonding interface. When the n-type GaP wafer 16 of this embodiment and the light-emitting layer forming portion 30 are bonded together, the carrier concentration at the bonding interface has a great effect on a resistance value obtained when energization is performed by crossing the bonding interface. That is, by setting the carrier concentration at a high value, generally, at not less than 1 E18/cm³, it is possible to reduce the interface resistance to a level incapable of being detected.

On the other hand, in the case of a relatively low carrier concentration of less than 1 E18/cm³, the interface resistance becomes remarkable and, for example, at 1 E17/cm³, current does not come up until applied voltages rise to 3 to 4 V. Although this mechanism has not been completely clarified, it might be thought that there are many electrical defects at the bonding interface and that in order to capture carriers, it is necessary to bury the defects with a sufficient number of carriers. When dissimilar materials are bonded as in this embodiment, barrier layers called kink occur because of different band gaps on both sides of the bonding interface. And it might be thought that this is also one of the causes. It might be thought that this mechanism has a bearing on the case of bonding wafers together and on other energization types.

Therefore, by raising the carrier concentration of the bonding interface in a portion to be energized, desirably to not less than 1 E18/cm³, current can be concentrated on this portion. The high carrier concentration layer 23 which forms a junction with this light-emitting layer forming portion 30 has a roughly rectangular boundary in the spreading direction along the light-emitting layer forming portion 30, and it is preferred that the area of this rectangle be approximately ¼ to ¹⁄₁₀ of the whole area forming a junction with the light-emitting layer forming portion 30. In this embodiment, this area is about ⅙. The four surface perpendicular to the light-emitting layer forming portion 30 of the n-type GaP wafer 16 are each formed so as to form the same plane surfaces as the four surfaces perpendicular to the light-emitting layer forming portion 30 of the p-type GaP wafer 15. Therefore, apparently, the number of the surfaces perpendicular to the light-emitting layer forming portion 30 can be regarded as to be four and, as a result, the outer shape of the semiconductor light-emitting device 3 becomes a roughly 14-hedron.

And the p-type GaP wafer 15 has a thickness of 250 μm and is Zn doped in a concentration of 3 E17/cm$^3$. On the other hand, the n-type GaP wafer 16 has a thickness of 250 μm and is Si doped in a concentration of 3 E17/cm$^3$ and in the region of the middle part along the bonding surface with the light-emitting layer forming portion 30, a high carrier concentration layer 23 which is Si doped in a concentration of, for example, not less than 1 E18/cm$^3$ is formed. The manufacturing method of the semiconductor light-emitting device 3 in which these p-type and n-type GaP wafers 15, 16 are used is the same as in the first embodiment.

When the semiconductor light-emitting device 3 is energized from the p-side electrode 41 and n-side electrode 42 thereof, the current flows selectively through the high carrier concentration layer 23 of low resistance. As a result, the current channel is limited to the middle part of the light-emitting layer forming portion 30. Therefore, injected carriers bond again in a concentrated manner in the active layer 35 in the middle part of this light-emitting layer forming portion 30 and emit light. The area of the light-emitting portion in the middle part is about 1/6 of the junction surface of the light-emitting layer forming portion 30. The light emitted in all directions becomes incident on the substantially transparent p-type and n-type GaP wafers 15, 16 from the light-emitting layer forming portion 30 and advances to the interface which defines the outer shape of the p-type and n-type GaP wafers 15, 16.

The semiconductor light-emitting device 3 has the same structure as in the first embodiment, with the exception that the means to limit the current channel to the middle part of the light-emitting layer forming portion 30 is different from the means used in the first embodiment. As a result, the luminance of the semiconductor light-emitting device 3 relative to inputted power, i.e., the light extraction efficiency is almost the same as in the first embodiment.

The current channel which connects the p-side electrode 41 and the n-side electrode 42 together is caused to flow current easily by providing the high carrier concentration layer 23 of low resistance and the light emitting portion is limited to the middle part of the light-emitting layer forming portion 30, whereby an increase in the light extraction efficiency could be verified. Incidentally, although an example in which the high carrier concentration layer 23 is formed in the n-type GaP wafer 16 has been described, it is possible to form a high carrier concentration layer (not shown) in the p-type GaP wafer 15. Also, a high carrier concentration layer may be formed in each of the n-type GaP wafer 16 has been described, it is possible to form a high carrier concentration layer (not shown) in each of the p-type and n-type GaP wafers 15, 16.

(Embodiment 4)

A semiconductor light-emitting device related to the fourth embodiment of the present invention, including the manufacturing method thereof, will be described by referring to FIGS. 6 and 7. FIG. 6 is a sectional view which schematically shows the construction of a semiconductor light-emitting device. FIG. 7 is a plan view which schematically shows the construction of this semiconductor light-emitting device during the manufacturing thereof. As shown in FIG. 6, this embodiment differs from the first embodiment in that the outer shape is roughly spherical, that the center part of a p-type GaP wafer in contact with the principal surface of a light-emitting layer forming portion is circular, that an n-side electrode is formed in circular shape. Hereafter, the same component parts as in the first embodiment are designated by like reference numerals, their descriptions are omitted, and only different component parts are described First, as shown in FIG. 6, the component elements of the main part of a semiconductor light-emitting device 4 are the same as in the first embodiment, with the exception of the shape of the middle part of a p-type GaP wafer 17 which forms a junction with the principal surface of the light-emitting layer forming portion 40, the shape of an n-side electrode 44, the outer shape, etc.

More specifically, the middle part of the p-type GaP wafer 17 having an energizable carrier concentration which forms a junction with the upper side of the drawing shown in FIG. 6, i.e., with the principal surface of the upper side of the light-emitting layer forming portion 40 is circular. In a surrounding region along the light-emitting layer forming portion 40 in the middle part of this circular p-type GaP wafer 17, inversion layer 25 in which the conductivity type is inversed to the n-type by ion implantation are formed. The inversion layer 25 defines a circular boundary along the light-emitting layer forming portion 40 and it is preferred that the area of this circle be approximately 1/4 to 1/10 of the whole area which forms a junction with the light-emitting layer forming portion 40 including the inversion layer 25. In this embodiment, this area is about 1/6. Surfaces other than a surface on which a p-side electrode 41 parallel to the light-emitting layer forming portion 40 is formed, are formed in hemispherical shape to provide roughly spherical surfaces.

The light-emitting layer forming portion 40 present in the center part in the vertical direction of the drawing shown in FIG. 6 is constituted by epitaxial growth layers similar to those of the first embodiment. The part forming the outer shape of the light-emitting device 4 of the light-emitting layer forming portion 40 is approximately the same as in the first embodiment, with the exception that this part forms a thin circular cylinder having a length equivalent to the lower thickness of the light-emitting layer forming portion 40.

In the n-type GaP wafer 18 having an energizable carrier concentration which forms a junction with the lower side of the drawing shown in FIG. 6, i.e., with the principal surface of the lower side of the light-emitting layer forming portion 40, surfaces other than a surface on which the n-side electrode 44 parallel to the light-emitting layer forming portion 40 is formed, are formed in hemispherical shape to provide roughly spherical surfaces. Therefore, the semiconductor light-emitting device 4 is formed from roughly spherical surfaces, with the exception of the p-side and n-side electrodes 41, 11 parallel to the light-emitting layer forming portion 40.

Next, the details of the component elements of the semiconductor light-emitting device 4 will be described according to the flow of manufacturing steps. By practically adopting the manufacturing process of the first embodiment to the step before separation into individual devices, the semiconductor light-emitting device 4 can be obtained. However, because the shape of the middle part of the p-type GaP wafer 17 which is in contact with the principal surface of the light-emitting layer forming portion 40 and is encircled by an inversion layer 25 is circular, it is necessary to make a change to patterning which realizes this and, at the same time, because the shape of an n-side electrode 44 is circular, it is necessary to make a change to patterning which realizes this.

Furthermore, in order to approximate the shape of a final semiconductor light-emitting device 4 similar to a sphere, the arrangement pattern of individual semiconductor light-emitting device structures 7 is changed to adapt to a shape permitting dicing in three directions intersecting each other at 60 degrees, i.e., to an arrangement having the outer shape of a hexagon on the plan view as shown in FIG. 7. In this case, the arrangement is such that a triangular part 51 to be discarded is generated on the plan view in the middle part enclosed by three adjacent semiconductor light-emitting device structures 7.

And as shown in FIG. 7, the semiconductor light-emitting device structures 7 provided with the p-side and n-side electrodes 41, 44 are separated into individual devices. Incidentally, for both the p-side and n-side electrodes 41, 44, the spacing between adjacent electrodes is about 577 μm. The p-side electrode 41 is a circle of 100 μm diameter and the n-side electrode 44 is a circle of 200 μm diameter. The p-side and n-side electrodes 41, 44 are disposed in the center part of the surfaces, on which the electrodes are formed, after separation into individual devices.

In separation into individual devices, on the p-type GaP wafer 17 side, a diamond blade (not shown) having a V-shaped section with a blade tip angle of 70 degrees is prepared and V-shaped grooves having a depth of, for example, about 250 μm are formed in the directions intersecting each other at 60 degrees by use of a dicer (not shown). At this time, the side opposite to the side where the V-shaped grooves are formed is protected, for example, with an adhesive tape (not shown).

Next, on the n-type GaP wafer side 18 side, a diamond blade having a V-shaped section with a blade tip angle of 60 degrees is prepared and V-shaped grooves having a depth of, for example, about 250 μm are formed in the directions intersecting each other at 60 degrees by use of a dicer (not shown). When the depth of the V-shaped grooves has reached about 250 μm, the V-shaped grooves reach the V-shaped grooves on the opposite side in opposed positional relation, with the result that the semiconductor light-emitting device structure 7 is separated along the cutting line. That is, the separated semiconductor light-emitting device structure 7 which is a hexagon and roughly 14-dedron on the plan view as shown in FIG. 7, is completed on an adhesive tape (not shown) reapplied to the opposite side. Incidentally, the depth of the V-shaped grooves may be about 240 μm each from both sides and the grooves may be finally separated by cleavage or braking under applied stress.

Next, the semiconductor light-emitting device structures 7 on an adhesive tape which have been separated as individual ones are spaced greatly from each other by expanding the adhesive tape and etched thereafter in a hydrochloric acid based etchant. The corners, sides and the like of the semiconductor light-emitting device structure 7, which is a polyhedron, are etched relatively fast, and as a result, the polyhedron becomes close to a spherical shape. And a semiconductor light-emitting device 4 having a roughly spherical shape as shown in FIG. 6 is obtained.

After the p-side electrode 41 and the n-side electrode 44 are each brought into a condition permitting connection with an outer power source for driving, this semiconductor light-emitting device 4 is sealed, usually, with epoxy resin (not shown) and used.

When the semiconductor light-emitting device 4 is energized from the p-side electrode 41 and n-side electrode 44 thereof, the current is limited to the middle part of the light-emitting layer forming portion 40 as in the first embodiment and the semiconductor light-emitting device 4 emits light. For example, much of the light which is emitted from the light-emitting layer forming portion 40 limited to the middle part, is taken out, at a critical angle of not more than about 27 degrees, from the interface or spherical surface on which the p-side or n-side electrode 41, 44 parallel to the light-emitting layer forming portion 40 to the outside and part of the light is reflected from the p-side or n-side electrode 41, 44 and taken out to the outside from the opposite direction.

For comparison, the second comparative semiconductor light-emitting device (not shown) was fabricated in which the inversion layer 25 of the semiconductor light-emitting device 4 is not formed and all other constitutional features are the same as the semiconductor light-emitting device 4. It became apparent that the luminance of the semiconductor light-emitting device 4 relative to inputted power, i.e., the light extraction efficiency is about 25% better than in the second comparative semiconductor light-emitting device. When compared to the semiconductor light-emitting device 1 fabricated in the first embodiment, it became apparent that the light extraction efficiency of the light-emitting device 4 is about 20% improved. As a result, it became apparent that the effect of the improvement of the light extraction efficiency obtained by limiting the current channel to the center part of the light-emitting layer forming portion 40 is equal to or better than the effect of the improvement of the improvement of the light extraction efficiency obtained by changing the outer shape of the semiconductor light-emitting device 4 from a polygonal shape to a roughly spherical shape.

In the semiconductor light-emitting device 4, it could be ascertained that a further improvement in the luminous efficiency relative to inputted power is achieved by narrowing the current channel which connects the p-side electrode 41 and the n-side electrode 44 together and limiting the light emitting portion to the middle part of the light-emitting layer forming portion 40 to from a roughly spherical outer shape. Incidentally, it is possible to limit the current channel by forming a high carrier concentration layer adopted in the third embodiment.

The present invention is not limited to the above-described embodiments and can be carried out through various modifications without departing from the gist of the present invention.

For example, in the above-described embodiments, the means to use the inversion layer formed in the peripheral part of a GaP wafer near the junction surface with the light-emitting layer forming portion and the means to use a high carrier concentration layer formed in the middle part were separately incorporated. However, when the two means are applied simultaneously, this does not provide a disadvantage even when this provides an advantage. That is, the current channel can be limited by using at least one means in at least one of the p-type and n-type GaP wafers in contact with the two principal surfaces of the light-emitting layer forming portion. Therefore, it is permissible to use these means by appropriately incorporating them in the p-type and n-type GaP wafers. Also, it is possible to combine the means to use the projection formed in the middle part (the recesses formed in the peripheral part) in place of the inversion layer formed in the peripheral part.

Although examples in which a p-type or n-type GAP wafer is used as the semiconductor substrate transparent to the light emitted in the light-emitting layer forming portion were shown, semiconductor substrates other than GaP may be used so long as they are semiconductor substrates which are transparent to the wavelength of the emitted light and have electrical conductivity.

The formation of an inversion layer or a high carrier concentration layer by the introduction of an impurity can be performed by thermal diffusion, plasma doping, etc. in addition to ion implantation. In all of these cases, by introducing an impurity to the semiconductor substrate side, it is possible to easily limit the current channel while avoiding the possibility of affecting the wavelength etc. of the emitted light due to the deterioration of the light-emitting layer forming portion, unlike a case where the means to limit the current channel to the middle part of the light-emitting layer forming portion is formed on the light-emitting layer forming portion.

In order to form a roughly spherical outer shape of a semiconductor light-emitting device, examples in which the plan view shape of a semiconductor light-emitting device structure in the previous step is a hexagon. However, for example, an octagon or other polygons may be used.

What is claimed is:

1. A semiconductor light-emitting device, comprising:
   a light-emitting layer forming portion which has a pn-junction permitting light emission at a specific wavelength and has two principal surfaces opposite each other;
   a semiconductor substrate of a first conductivity type which is integrally joined to one principal surface of the light-emitting layer forming portion and is substantially transparent to the wavelength, the semiconductor substrate of the first conductivity type having a joined surface on the one principal surface of the light-emitting layer forming portion, an outer side surface which is inclined so that the width is large on a side near the light-emitting layer forming portion and becomes narrow on a side away from the light-emitting layer forming portion and a further surface opposite the joined surface of the semiconductor substrate of the first conductivity type;
   a first electrode which is disposed on the further surface of the semiconductor substrate of the first conductivity type;
   a semiconductor substrate of a second conductivity type which is integrally joined to the other principal surface of the light-emitting layer forming portion and is substantially transparent to the wavelength, the second conductivity being reverse to the first conductivity, the semiconductor substrate of the second conductivity type having a joined surface on the other principal surface of the light-emitting layer forming portion, an outer side surface which is inclined so that the width is large on a side near the light-emitting layer forming portion and becomes narrow on a side away from the light-emitting layer forming portion and a further surface opposite the joined surface of the semiconductor substrate of the second conductivity type;
   a second electrode which is disposed on the further surface of the semiconductor substrate of the second conductivity type; and
   a semiconductor layer selectively formed in a region of at least one of the semiconductor substrate of the first conductivity type and the semiconductor substrate of the second conductivity type, an impurity being introduced into the semiconductor layer so that a current is caused to flow in concentrated manner through a middle part of the principal surfaces of the light-emitting layer forming portion via the first electrode and the second electrode.

2. The semiconductor light-emitting device according to claim 1,
   wherein the conductivity type of the semiconductor layer is reverse to the conductivity type of the semiconductor substrate on which the semiconductor layer is formed and the semiconductor layer is formed around a middle part of the joined surface of the semiconductor substrate on which the semiconductor layer is formed.

3. The semiconductor light-emitting device according to claim 2,
   wherein the semiconductor layer formed around the middle part of the joined surface has an inner circumference having a rectangular plane shape and the area of the rectangle is about ¼ to about ⅒ of the area of the joined surface on the principal surface of the light-emitting layer forming portion.

4. The semiconductor light-emitting device according to claim 2,
   wherein the semiconductor layer is formed in a middle part of the joined surface of the semiconductor substrate on which the semiconductor layer is formed, has the same conductivity type as the conductivity type of the semiconductor substrate on which the semiconductor layer is formed, and has a carrier concentration which is higher than that of portions other than the middle part of the semiconductor substrate on which the semiconductor layer is formed.

5. The semiconductor light-emitting device according to claim 4,
   wherein the carrier concentration of the semiconductor layer is not less than 1 E18/cm$^3$.

6. The semiconductor light-emitting device according to claim 4,
   wherein the semiconductor layer formed in the middle part of the joined surface has an outer circumference having a rectangular plane shape and the area of the rectangle is about ¼ to about ⅒ of the area of the joined surface on the principal surface of the light-emitting layer forming portion.

7. The semiconductor light-emitting device according to claim 1,
   wherein each of the semiconductor substrate of the first conductivity type and the semiconductor substrate of the second conductivity type is roughly spherical.

8. The semiconductor light-emitting device according to claim 1,
   wherein the light-emitting layer forming portion, the semiconductor substrate of the first conductivity type and the semiconductor substrate of the second conductivity type constitute a 14-hedron.

9. The semiconductor light-emitting device according to claim 1,
   wherein the impurity is introduced into the semiconductor layer by one of ion implantation, thermal diffusion and plasma doping processes.

10. A semiconductor light-emitting device comprising:
    a light-emitting layer forming portion which has a pn-junction permitting light emission at a specific wavelength and has two principal surfaces opposite each other;
    a semiconductor substrate of a first conductivity type which is integrally joined to one principal surface of the light-emitting layer forming portion and is substantially transparent to the wavelength, the semiconductor substrate of the first conductivity type having a joined surface on the one principal surface of the light-emitting layer forming portion and a further surface opposite the joined surface of the semiconductor substrate of the first conductivity type;

a first electrode which is disposed on the further surface of the semiconductor substrate of the first conductivity type;

a semiconductor substrate of a second conductivity type which is integrally joined to the other principal surface of the light-emitting layer forming portion and is substantially transparent to the wavelength, the second conductivity being reverse to the first conductivity, the semiconductor substrate of the second conductivity type having a joined surface on the other principal surface of the light-emitting layer forming portion and a further surface opposite the joined surface of the semiconductor substrate of the second conductivity type;

a second electrode which is disposed on the further surface of the semiconductor substrate of the second conductivity type; and a semiconductor layer formed in a middle part of the joined surface of at least one of the semiconductor substrate of the first conductivity type and the semiconductor substrate of the second conductivity type, an impurity of the same conductivity type as the conductivity type of the semiconductor substrate on which the semiconductor layer is formed being introduced in the semiconductor layer so as to have a higher carrier concentration than portions other than the middle part of the semiconductor substrate on which the semiconductor layer is formed;

at least one of the semiconductor substrate of the first conductivity type and the semiconductor substrate of the second conductivity type having an outer side surface which is inclined so that the width is large on a side near the light-emitting layer forming portion and becomes narrow on a side away from the light-emitting layer forming portion.

11. The semiconductor light-emitting device according to claim 10, wherein the carrier concentration of the semiconductor layer is not less than 1 E18/cm$^3$.

12. The semiconductor light-emitting device according to claim 10, wherein the semiconductor layer formed in the middle part of the joined surface has a rectangular plane shape and the area of the rectangle is about ¼ to about ¹⁄₁₀ of the area of the joined surface on the principle surface of the light-emitting forming portion is bonded.

13. The semiconductor light-emitting device according to claim 10, wherein the impurity is introduced into the semiconductor layer by one of ion implantation, thermal diffusion and plasma doping processes.

14. The semiconductor light-emitting device according to claim 10, wherein each of the semiconductor substrate of the first conductivity type and the semiconductor substrate of the second conductivity type is roughly spherical.

15. The semiconductor light-emitting device according to claim 10, wherein the light-emitting layer forming portion, the semiconductor substrate of the first conductivity type and the semiconductor substrate of the second conductivity type constitute a 14-hedron.

* * * * *